United States Patent [19]

Wong

[11] Patent Number: 5,402,443
[45] Date of Patent: Mar. 28, 1995

[54] DEVICE AND METHOD FOR MEASURING THE JITTER OF A RECOVERED CLOCK SIGNAL

[75] Inventor: Hee Wong, San Jose, Calif.

[73] Assignee: National Semiconductor Corp., Santa Clara, Calif.

[21] Appl. No.: 991,850

[22] Filed: Dec. 15, 1992

[51] Int. Cl.$^6$ .............................................. H04L 7/00
[52] U.S. Cl. ........................................ 375/10; 375/371
[58] Field of Search ........................ 375/118, 117, 10; 328/63, 127, 133, 134; 364/828, 829; 307/510, 511, 527; 331/1 R, 17, 25, 172; 324/76, 77; 370/17; 455/67.6, 226.1, 226.4

[56] References Cited

U.S. PATENT DOCUMENTS

| | | | |
|---|---|---|---|
| 3,711,773 | 1/1973 | Hekimian et al. | 324/83 R |
| 3,778,704 | 12/1973 | Lubarsky et al. | 324/57 R |
| 4,320,516 | 3/1982 | Kammerlander | . |
| 4,654,861 | 3/1987 | Godard | 375/10 |
| 4,819,080 | 4/1989 | Cucchietti et al. | 375/118 |
| 4,975,634 | 12/1990 | Shohet | 324/83 R |
| 5,056,054 | 10/1991 | Wong et al. | 364/724.01 |
| 5,128,968 | 7/1992 | Yoshida | 375/118 |
| 5,132,633 | 7/1992 | Wong et al. | 328/14 |
| 5,214,676 | 5/1993 | Wilkinson | 328/127 |
| 5,224,125 | 6/1993 | Wong et al. | 375/82 |
| 5,239,561 | 8/1983 | Wong et al. | . |
| 5,241,285 | 8/1993 | Jackson | 331/17 |
| 5,245,636 | 9/1993 | Sari et al. | 375/118 |
| 5,295,079 | 3/1994 | Wong et al. | . |
| 5,351,275 | 9/1994 | Wong et al. | . |

FOREIGN PATENT DOCUMENTS 0011699 6/1980 European Pat. Off. .
62-284268 12/1987 Japan .

OTHER PUBLICATIONS

Abu-El-Jaija, A. I. 'Fast Measurement of Telephone Channel Phase Characteristics', Part 1: Method Description. IEE Proceedings F. Communications, Radar & 1-16 Signal Processing, vol. 134, No. 5, Aug. 1987, Stevenage GB, pp. 481-486.

Abu-El-Jaija, A. I. 'Fast Measurement of Telephone Channel Phase Characteristics', Part 2: Method Analysis. IEE Proceedings F. Communications, Radar & 1-16 Signal Processing, vol. 134, No. 5, Aug. 1987, Stevenage GB, pp. 487-491.

*Primary Examiner*—Stephen Chin
*Assistant Examiner*—Timothy J. May
*Attorney, Agent, or Firm*—Limbach & Limbach; H. Donald Nelson; Richard J. Roddy

[57] ABSTRACT

A jitter extraction circuit, which includes a cyclic phase differentiator, a control loop, and a jitter integrator, measures the jitter of a recovered clock signal formed from an incoming data bit stream. The phase differentiator differentiates a phase data word, which includes both a jitter component and a delta frequency component, to produce a differentiated phase data word. The control loop estimates and removes the delta frequency component to produce a filtered data word which primarily represents the jitter component. The jitter integrator recovers the original jitter component by integrating the filtered data word to produce a jitter data word. The jitter of the recovered clock signal is determined by the statistics of the jitter data words.

16 Claims, 5 Drawing Sheets

DEVICE AND METHOD FOR MEASURING THE JITTER OF A RECOVERED CLOCK SIGNAL

BACKGROUND OF THE INVENTION

1. Field of the Invention

The present invention relates to the extraction of a recovered clock signal from an incoming data bit stream received from a communications system and, in particular, to a device and method for measuring the jitter of the recovered clock signal.

2. Description of the Related Art

A clock synchronizer is a device that generates a recovered clock signal from an incoming data bit stream received from a communications system. The recovered clock signal is typically generated by a process, known as a "look-and-predict" technique, which produces a set of long-term timing statistics from the incoming data bit stream and then generates the recovered clock signal based on the timing statistics. Ideally, the recovered clock signal is generated so that a close phase agreement exists between the incoming data bit stream and the recovered clock signal.

The term "close phase agreement" defines a detection position within each bit cell of the incoming data bit stream, which is known as the center of the signal eye, at which the active edges of the recovered clock signal should be located. The amount of unwanted phase movement of the recovered clock signal away from the detection position is defined as the jitter of the recovered clock signal. Jitter, which is measured over a long period of time, is by definition a statistical measurement.

The "look-and-predict" technique, as described above, can introduce jitter into the recovered clock signal due to differences between the instantaneous timing of the incoming bit stream and the long-term timing statistics. Clock jitter is harmful because jitter increases symbol detection errors and, consequently, transmission errors. Thus, to accurately predict the performance of a digital communication system, there is a need to measure the jitter of the recovered clock signal.

Conventionally, jitter is measured utilizing either a digital oscilloscope or a Bit Error Rate Tester (BERT). The digital oscilloscope provides a fast and interactive method for measuring jitter. However, it often produces underestimates of the actual amount of jitter. The BERT, on the other hand, is a slow and non-interactive method, but offers very precise jitter limit measurements.

Both of these methods require access to the recovered clock signal so that clock timing information can be extracted. In the case of the digital oscilloscope, recovered clock edges are translated into time displacement image vectors. An accumulation of these image vectors produces a statistical display of the jitter values on the oscilloscope screen.

The statistical display, however, may not show the actual peak-to-peak jitter value of the recovered clock signal because digital oscilloscopes, which trace the recovered clock signal, require a very long processing time after each trace. During the processing periods, the clock jitter readings are ignored and not displayed.

In the case of the BERT, recovered clock edges are translated into binary error counts, i.e., only errors and non-errors are recorded. Since the results contain no quantified time values, users must run repeated tests to obtain a full jitter distribution chart.

Thus, there is a need for a device and method for measuring jitter which provides fast, interactive, and precise jitter measurements, and which minimizes the external test system required to extract the jitter measurements.

The jitter requirements for a clock synchronizer utilized in a Fiber Distributed Data Interface (FDDI) network is specified by the "System Jitter Allocation Budget for Guaranteed Interconnections" section of the Draft Proposed American National Standard on "FDDI Physical Layer Medium Dependent (PMD) document", X3T9.5/84-48, May 20, 1988.

The FDDI network provides a high bandwidth interconnection among computers and peripheral equipment using fiber optics as the transmission media. The symbols are transmitted synchronously, at a rate of 125 Mega-symbols per second. The modulation scheme is Non-Return-to-Zero Inverted (NRZI) with a nominal symbol period of 8 nSec (nanoseconds).

An optical receiver is used to convert the FDDI optical symbol stream to an electrical signal. After the conversion, the symbol information is detected by a detector circuit which receives timing information from a clock synchronizer. As described above, the clock synchronizer, based on the symbol timing history, creates a recovered clock signal which is fed back to the detector circuit.

If there are no imperfections introduced along the transmission path (including the optical to electrical conversion), a maximum "signal eye opening" of 8 nSec would be expected at the inputs of the clock synchronizer and the symbol detector. However, there are many types of imperfections and interferences affecting the incoming signal quality during the transmission. For these reasons, the FDDI standard committee has proposed a jitter budget for guiding the development of the FDDI optical receiver so that better equipment interoperability can be achieved.

The budget recommendation is based on a requirement that any FDDI station shall not exceed a bit error rate of $2.5 \times 10^{-10}$ under any conditions that meet the FDDI proposed standards. A condensed outline from the jitter budget is as follows:

a. The signal at the input of the clock synchronizer may contain the following types of imperfections:
   Duty Cycle Distortion (DCD)
   Data Dependent Jitter (DDJ)
   Random Jitter (RJ)
   The combination of all these imperfections shall not exceed 5.9 nsec peak-to-peak. This translates to a minimum "eye opening" of 2.1 nsec (8−5.9=2.1 nsec) measured at the inputs of the clock synchronizer and the symbol detector.

b. In order to achieve the specified bit error rate ($2.5 \times 10^{-10}$), the jitter of the recovered clock shall be kept below 3.3 nsec peak-to-peak. The reason this value (3.3 nSec) can exceed the "signal eye opening" of 2.1 nsec is some components of the two jitter values (jitter generated from the clock synchronizer and the jitter value measured at the synchronizers input) are considered to be uncorrelated (i.e., the total budget from the nominal symbol period of 8 nsec is divided down into component-vectors, uncorrelated vectors are summed vectorially and the algebraic sum of all the quantities is 8 nsec).

For a well-designed FDDI clock synchronizer, the jitter of the recovered clock signal is around 0.5 to 1.5 nSec peak-to-peak. The remaining margin (3.3-1.5 nSec) is reserved for the static alignment error (SAE) and other imperfections. Thus, in order to obtain reliable jitter measurements in accordance with the FDDI specification, there is a need for a device and method for measuring jitter which provides a phase resolution of 100 pSec (picoseconds) or better.

SUMMARY OF THE INVENTION

In accordance with the present invention, a jitter extraction circuit for measuring the jitter of a recovered clock signal is disclosed.

The jitter extraction circuit requires no recovered clock output from the clock synchronizer. Instead, it takes a continuous stream of digital phase data words from the clock synchronizer. The stream of phase data words contain phase movement information (jitter) of the recovered clock signal. The jitter extraction circuit converts the stream of phase data words into jitter data words by means of digital signal processing techniques. The jitter data words can then be quickly and precisely interpreted by low-cost test equipment (such as a personal computer) to generate jitter statistics. The jitter extraction circuit continuously converts the phase data words, thereby eliminating unnecessary processing time. In addition, the jitter extraction circuit and a clock synchronizer can be integrated onto the same silicon chip.

The jitter extraction circuit includes a cyclic phase differentiator that differentiates an externally-generated phase data word to produce a differentiated phase data word. The cyclic phase differentiator can be formed, for example, by utilizing a phase delay circuit and a phase subtractor.

The phase delay circuit receives a current phase data word and generates a previously received phase data word in response to the received phase data word. The phase subtractor receives both the current phase data word and the previously received phase data word and subtracts the previously received phase data word from the current phase data word to produce the differentiated phase data word.

The jitter extraction circuit further includes a control loop that estimates and removes a delta frequency component from the differentiated phase data word to produce a filtered data word. The control loop can be formed, for example, by a velocity subtractor and a velocity integrator.

The velocity subtractor receives both the differentiated phase data word and an estimated delta frequency data word and subtracts the estimated delta frequency data word from the differentiated phase data word to produce a filtered data word. The velocity integrator receives the filtered data word and integrates the filtered data word to produce the estimated delta frequency data word. The estimated delta frequency data word represents an estimate of the delta frequency component.

The jitter extraction circuit also includes a jitter integrator that integrates the filtered data word to produce a jitter data word. The jitter of the recovered clock signal is determined by the statistics of the jitter data words.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
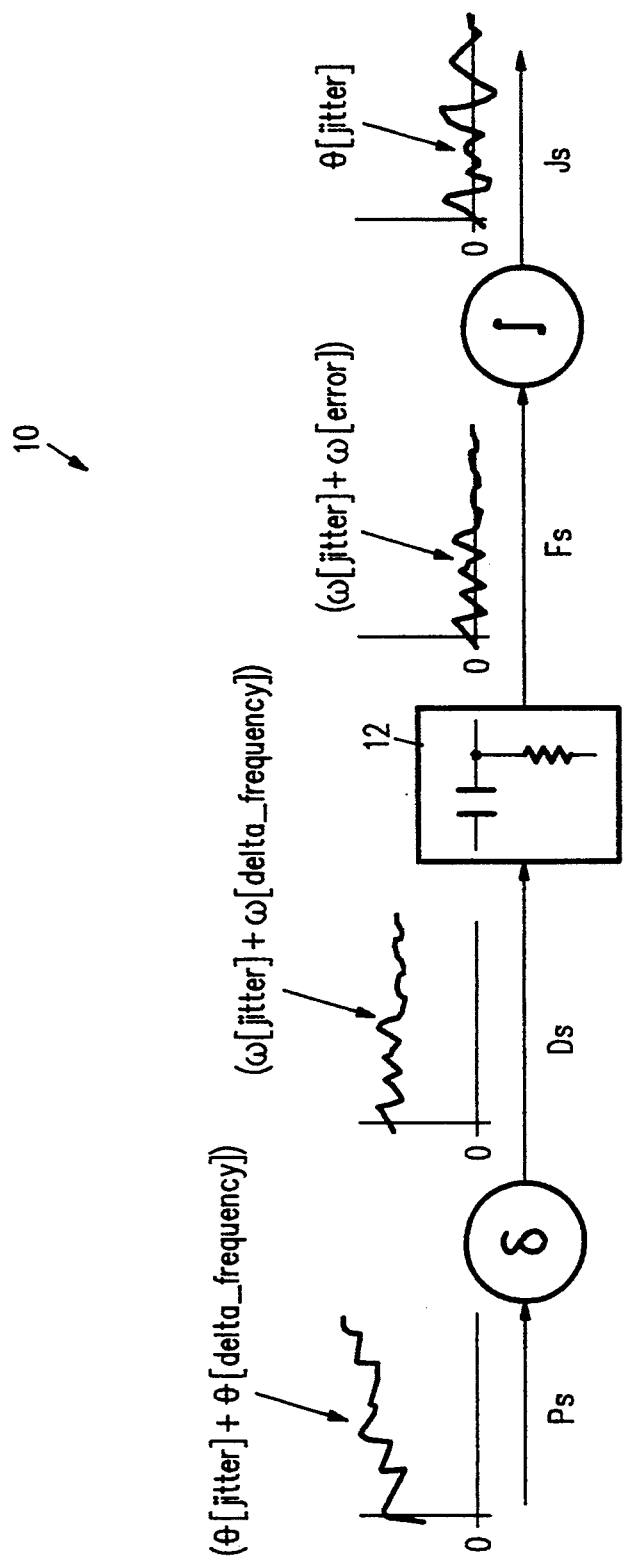
FIG. 1 is a conceptual representation illustrating a jitter extraction circuit 10 operating on an input phase signal Ps in accordance with the present invention.

FIG. 1 shows a conceptual representation of a jitter extraction circuit 10 operating on an input phase signal Ps in accordance with the present invention.

As shown in FIG. 1, the jitter extraction circuit 10 differentiates $\delta$ the input phase signal Ps to produce a differentiated phase signal Ds. The input phase signal Ps, which represents a phase difference between a recovered clock signal (not shown in FIG. 1) and an incoming data bit stream (not shown in FIG. 1), includes both a variable jitter component $\theta$[jitter] and a relatively linear delta frequency component $\theta$[delta_frequency]. The jitter component $\theta$[jitter] represents the jitter of the recovered clock signal. As described in greater detail below, the delta frequency component $\theta$[delta_frequency] represents an unwanted frequency variation between the recovered clock signal and the incoming data bit stream.

The jitter extraction circuit 10 differentiates both the jitter component $\theta$[jitter] and the delta frequency component $\theta$[delta_frequency], with respect to time, to produce both a differentiated jitter component $\omega$[jitter] and a differentiated delta frequency component $\omega$[delta_frequency] of the differentiated phase signal Ds. Since the delta frequency component $\theta$[delta_frequency] of the phase signal Ps is relatively linear and since the mathematical derivative of a linear function is a constant, the differentiated delta frequency component $\omega$[delta_frequency] of the differentiated phase signal Ds can be assumed to be constant.

As shown in FIG. 1, the constant differentiated delta frequency component $\omega$[delta_frequency] is then filtered out of the differentiated phase signal Ds by a high pass filter 12 to produce a filtered phase signal Fs. A jitter signal Js is then obtained by integrating $\int$ the filtered phase signal Fs, which primarily represents the differentiated jitter component $\omega$[jitter] after the differentiated delta frequency component $\omega$[delta_frequency] has been removed. The jitter of the recovered clock signal can then be determined by the statistics of the jitter signal Js.

In the preferred embodiment of the present invention, the phase signal Ps is generated by a clock synchronizer as described in the following U.S. Patents: Ser. No. 730,228, entitled Phase Detector for Very High Frequency Clock/Data Recovery circuits, Ser. No. 731,138, entitled Phase Error Processor, Ser. No. 729,973, entitled Digital Serial Loop Filter, Ser. No. 681,095, entitled Digital Signed Phase-to-Frequency Converter for Very High Frequency PLL's, and Ser. No. 703,404, entitled Frequency Controlled Oscillator for Very High Frequency PLL's, which are hereby incorporated by reference.

The phase signal Ps generated by the above-referenced clock synchronizer, which represents a phase difference between a 250 MHz reference clock signal and the incoming data bit stream, is generated as a seven-bit phase data word at a rate of 15.625 Megawords per second. The period of the 250 MHz reference clock signal is divided into 96 incremental phase positions or counts which are represented by the phase data words. Thus, the phase data words represent a count value and each count represents a phase difference of 41.7 picoseconds (the 4 nanosecond period of the 250 MHz reference clock signal divided by 96 counts yields 41.7 picoseconds).

Since the phase of the 250 MHz reference clock signal is cyclic (360° and 0° coincide with each other), the 96 count values represented by the phase data words are also cyclic (96 and 0 depict the same phase position). For example, when a previously received phase data word with a count value of 4 is subtracted from a current phase data word with a count value of 5, the result is 1. Similarly, when a previously received phase data word with a count value of 95 is subtracted from a current phase data word with a count value of 0, the result is also 1.

The 250 MHz reference clock signal is divided by two by the above-referenced clock synchronizer to generate a 125 MHz recovered clock signal in accordance with the Fiber Distributed Data Interface (FDDI) specifications. As stated above, the FDDI protocol specifies transmission of symbols synchronously at a rate of 125 Mega-symbols per second.

As stated above, each period of the 250 MHz reference clock signal is divided by 96 counts to produce a phase resolution of 41.7 picoseconds. To measure the jitter of the 125 MHz recovered clock signal, which has twice the period of the 250 MHz reference clock signal, with an equivalent phase resolution, twice or 192 counts are required. In the preferred embodiment of the present invention, 192 counts are obtained by utilizing the 96 counts twice to represent one period of the 125 MHz signal.

At any instant, a phase data word can be used to find the incremental phase offset between the 125 MHz recovered clock signal and the incoming data bit stream. For example, if a previous phase data word has a value of four counts and a current phase data word has a value of five counts, then an incremental phase offset of 41.7 picoseconds (41.7 * (5−4)) exists between the recovered 125 MHz clock signal and the incoming data bit stream.

If the frequency of the recovered clock signal locks onto the frequency of the input data bit stream, the phase data word could be used directly to determine the jitter of the recovered clock signal. Thus, in the above example, a count difference of 1 could be directly interpreted as a jitter of 41.7 picoseconds during that period. The accumulation of count values over a long period of time could then be utilized to statistically determine the jitter of the recovered clock signal.

However, this rarely happens in practice because there is always a frequency difference between the incoming data bit stream and the recovered clock signal due to the asynchronous nature of communication systems. The frequency difference between the incoming data bit stream and the recovered clock signal continuously changes the phase of the recovered clock signal in relation to the incoming data bit stream. The continuous phase change causes the count value of each succeeding phase data word to continuously change.

For example, continuing with the above example, the frequency difference alone could cause a second phase data word to have a count value of 5 (the phase data words are updated at a 15.625 MHz rate) and a third phase data word to have a count value of 6. If there were no noise in the system, the sign of the frequency difference determines whether the count increases or decreases and the magnitude of the frequency difference sets the rate of increase or decrease.

The frequency difference interferes with a jitter determination and makes a direct utilization of the phase data words infeasible in actual practice because, in addition to representing a jitter component, each phase data word also represents a delta frequency component which is due to the difference in frequency. Fortunately, the frequency difference, unlike jitter, changes the count value of the phase data words in a relatively linear pattern. This is due to the fact that the frequencies of the recovered clock signal and the input data stream do not change abruptly. Thus, as stated above, by differentiating the phase data words, a delta frequency component represented by the phase data words is transformed into a constant which can be estimated and removed.

Figure 2:
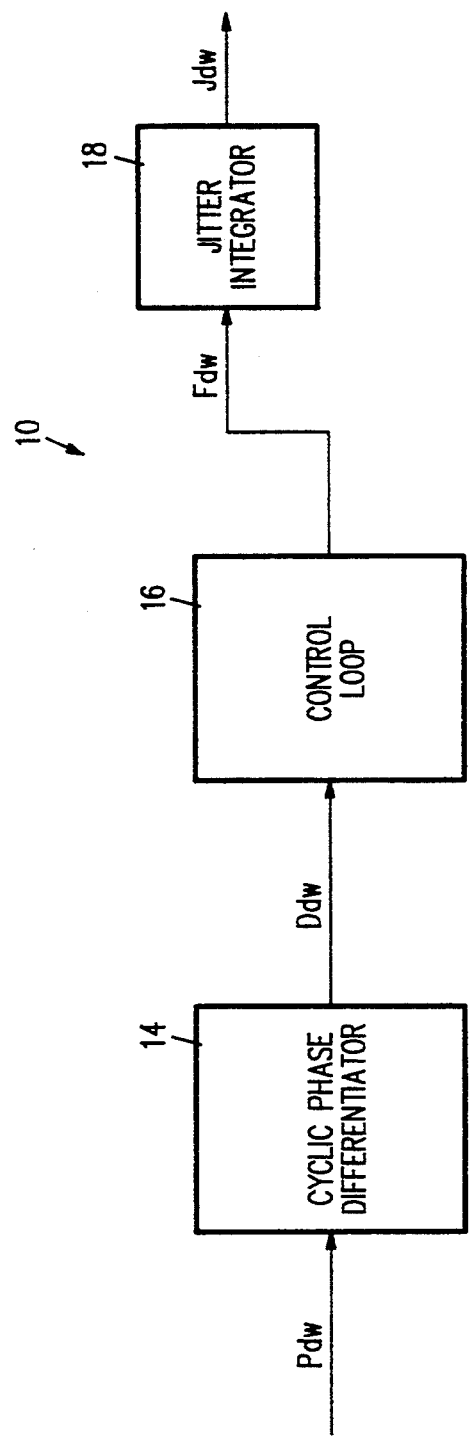
FIG. 2 is a block diagram illustrating an embodiment of the jitter extraction circuit in accordance with the present invention.

FIG. 2 shows an embodiment of a jitter extraction circuit 10 for measuring the jitter of the recovered clock signal (not shown in FIG. 2) in accordance with the present invention. As shown in FIG. 2, jitter extraction circuit 10 includes a cyclic phase differentiator 14 that differentiates each phase data word Pdw to produce a differentiated phase data word Ddw, a control loop 16 that estimates and removes the delta frequency component from each differentiated phase data word Ddw to produce a filtered phase data word Fdw, and a jitter integrator 18 that integrates each filtered phase data word Fdw to produce a jitter data word Jdw. Each jitter data word Jdw represents the jitter of the recovered clock signal during one period of the recovered clock signal.

Figure 3:
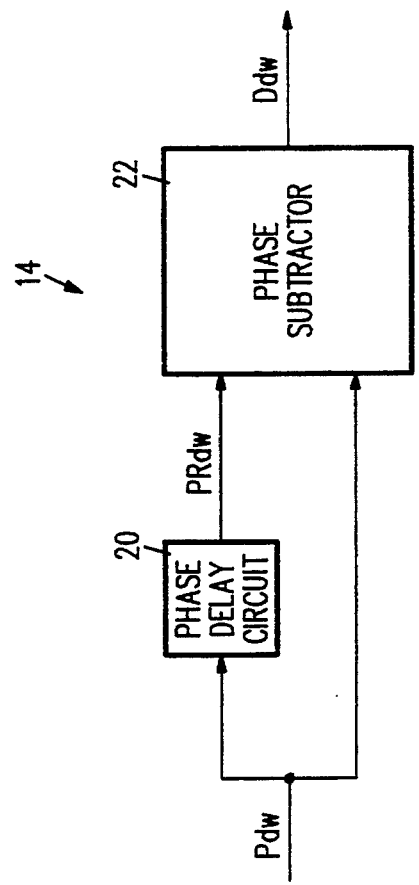
FIG. 3 is a block diagram illustrating the cyclic phase differentiator 14 in accordance with the present invention.

FIG. 3 shows a block diagram of the cyclic phase differentiator 14 in accordance with the present invention. As shown in FIG. 3, the cyclic phase differentiator 14 includes a phase delay circuit 20 that receives a current phase data word Pdw from the above-reference clock synchronizer and that generates a previously received phase data word PRdw in response to the received phase data word Pdw, and a phase subtractor 22 that receives both the current phase data word Pdw and the previously received phase data word PRdw and that subtracts the previously received phase data word PRdw from the received phase data word Pdw to produce the differentiated phase data word Ddw.

The differentiated phase data word Ddw includes both the differentiated jitter component $\omega[\text{jitter}]$ and the differentiated delta frequency component $\omega[\text{del-}$ ta_frequency]. Both the differentiated jitter component ω[jitter] and the differentiated delta frequency component ω[delta_frequency] are angular velocity quantities measured in radians per second where each count is equivalent to 0.0327 radians.

The subtracting operation of the phase subtractor 20, which has the effect of mathematically differentiating the phase data word Pdw, can be expressed by the following equation:

$$CPD_{(nt)} = PAP_{(nt)} \sim PAP_{(mt)}$$

where $CPD_{(nt)}$ represents the differentiated phase data word Ddw, $PAP_{(nt)}$ represents a phase data word Pdw at time nt, $PAP_{(mt)}$ represents a phase data word Pdw at time mt, n & m are integers and m=n−1, t is the sampling period (i.e., 1/15.625 MHz), and ~ represents a cyclical subtraction.

The design of the above-referenced clock synchronizer guarantees that each phase data word Pdw can only change +/−1 counts over the previous phase data word. Thus, the differentiated phase data word Ddw, which is generated as a 2-bit data word, can have only three possible values, i.e., +/−1 and 0. To represent a phase data word which includes complex values, such as the jitter component θ[jitter] and the delta frequency component θ[delta_frequency], the cyclic phase differentiator samples the phase data words Pdw at a rate of 15.625 MHz. The 15.625 MHz sampling rate is about 100 times higher than the maximum frequency component (about 150 KHz) of either the jitter component θ[jitter] or the delta frequency component θ[delta_frequency].

Figure 4:
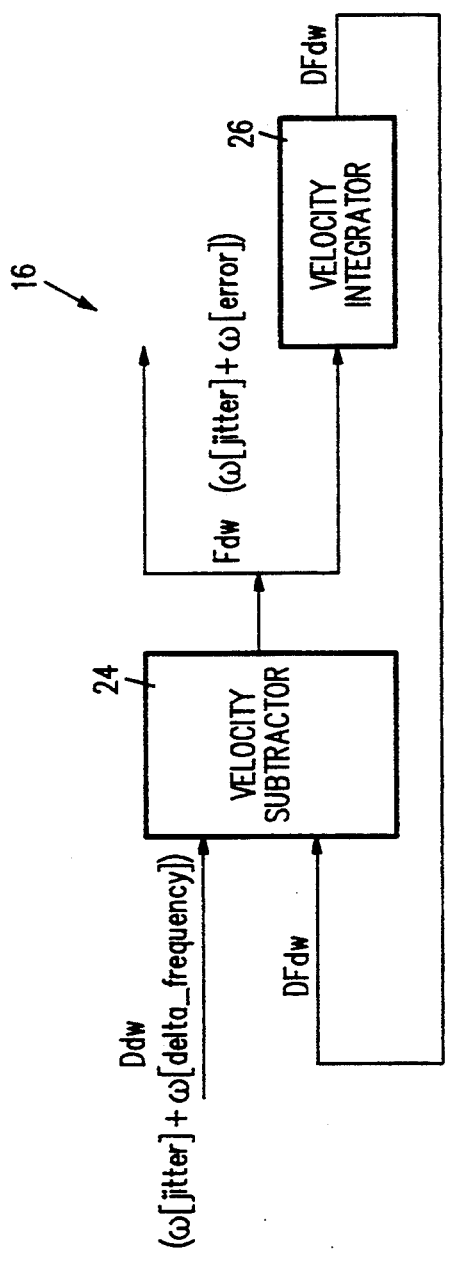
FIG. 4 is a block diagram illustrating the control loop 16 in accordance with the present invention.

FIG. 4 shows a block diagram of the control loop 16 in accordance with the present invention. As shown in FIG. 4, the control loop 16, which estimates and removes the delta frequency component from each differentiated phase data word Ddw, includes a velocity subtractor 24 and a velocity integrator 26. The velocity subtractor 24 receives both the differentiated phase data word Ddw and an estimated delta frequency data word DFdw and subtracts the estimated delta frequency data word DFdw from the differentiated phase data word Ddw to produce the filtered phase data word Fdw.

The subtracting operation of the velocity subtractor 22, which has the effect of filtering the delta frequency component out of the differentiated data word Ddw, can be expressed mathematically by the following equation:

$$(VSub_{(nt)} = CPD_{(nt)} - VInt_{(nt)})$$

where $VSub_{(nt)}$ represents the filtered data word Fdw in radians per second, $CPD_{(nt)}$ represents the differentiated data word Ddw, $VInt_{(nt)}$ represents the estimated delta frequency data word DFdw, n is an integer, and t is the sampling period (i.e., 1/15.625 MHz).

After the subtraction, the filtered data word Fdw actually has two remaining components, the differentiated jitter component ω[jitter] and an error component ω[error]. The error component ω[error], which is an unwanted component, affects the readout accuracy of the jitter data word when the differentiated jitter component ω[jitter] is subsequently integrated.

The error component ω[error] is generated when the estimated delta frequency data word DFdw fails to represent the instantaneous value of the actual differentiated delta frequency component ω[delta_frequency]. The estimated delta frequency data word DFdw can fail to represent the instantaneous value of the actual differentiated delta frequency component ω[delta_frequency] when small changes in the differentiated delta frequency component ω[delta_frequency], due to phase jitters of the reference clock signal, are present. Fortunately, the magnitude of the error component ω[error] is usually below 100 pSec and can be kept even lower if the reference clock signal is generated from a crystal clock source. In general, the error component ω[error] of the filtered data word Fdw can be ignored since the differentiated jitter component ω[jitter] is in the nanosecond range.

As stated above, the differentiated data word Ddw is represented by a 2-bit word which represents either a +/−1 or 0. Similarly, the estimated delta frequency data word DFdw is also represented by a 2-bit word which represents either a +/−1 or 0. Thus, the filtered data word Fdw can be represented by a 3-bit word which is limited to 5 discrete values, i.e., +/−2, +/−1 and 0.

The filtered data word Fdw can be further compressed into a 2-bit format, similar to the format used for the differentiated phase data word Ddw and the estimated delta frequency data word DFdw. The 2-bit format, utilizing +/−1 and 0, is cost effective for interfacing with other circuit blocks in the system.

The 2-bit format can be generated by redistributing the output sequence of the filtered data word Fdw. The "redistributing technique" can be illustrated as a 3-bit data sequence, represented by "+2, −1, 0, ... ", which can be redistributed as an extended 2-bit sequence, represented by "+1, +1, −1, ... ". The redistribution technique can also be illustrated as a 2-bit sequence "+2, −1", which can be redistributed as a "+1, 0" sequence since the "+1" and "−1" of a "+1, +1, −1" sequence cancel each other out.

Figure 6:
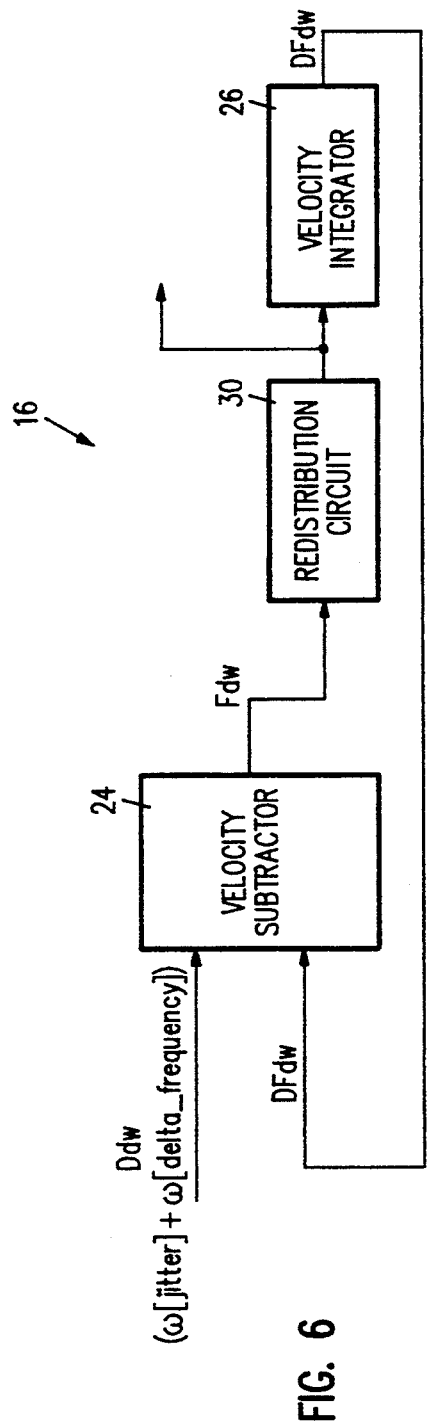
FIG. 6 is a block diagram illustrating the control loop with a redistribution circuit 30.

As shown in FIG. 6, the redistribution technique is implemented with a redistribution circuit 30. The redistribution circuit 30, which consists of registers and logic circuits, converts each "−2" increment into two "−1" increments and each "+2 increment into two "+1" increments, and combines "+1" increments with "−1" increments. After redistribution, the running average value of the filtered data word Fdw remains unchanged if the dynamic range of filtered data word Fdw is less than half of the peak value of both the differentiated data word Ddw and the estimated delta frequency data word DFdw. This is possible because the dynamic range of the differentiated jitter component ω[jitter] and the error component ω[error] represented by the filter data word Fdw are assumed to be a small fraction of the peak value of the differentiated data word Ddw and the estimated delta frequency data word DFdw.

As stated above, the velocity subtractor 24, in conjunction with the velocity integrator 26, forms the control loop. The control loop minimizes the value of the error component ω[error] by estimating the value of the differentiated delta frequency component ω[delta_frequency]. Once the control loop settles, the error component ω[error] is forced to have values close to zero. Thus, the filtered data word Fdw primarily represents only the differentiated jitter component ω[jitter] of the phase data word.

As shown in FIG. 1, the velocity subtractor 24 and the velocity integrator 26 function effectively as a 1st-order high pass filter 12 that rejects the low frequency delta frequency component ω[delta_frequency] while accepting the high frequency jitter component ω[jitter].

The difference is in the dimension of the loop signals, which is "radians per second" instead of "Volts".

As further shown in FIG. 4, the velocity integrator 26 receives the filtered data word Fdw, which includes both the differentiated jitter component ω[jitter] and the error component ω[error], and integrates the filtered data word Fdw to produce the estimated delta frequency data word DFdw, which includes both an integrated jitter component I[jitter] and an integrated error component I[error]. The integrated error component I[error] represents a long term estimate of the differentiated delta frequency component ω[delta_frequency].

Although the filtered data word Fdw has two components, the only component affecting the estimated delta frequency data word DFdw is the error component ω[error] because the error component ω[error] has a non-zero-mean value prior to the control loop settling. The velocity integrator 26 integrates the non-zero-mean value of the error component ω[error] to produce the integrated error component I[error]. The differentiated jitter component ω[jitter], on the other hand, is assumed to have a zero-mean value. Thus, the integrated jitter component I[jitter] is assumed to be zero.

The velocity integrator 26 integrates the filtered data word Fdw by totaling the count value of each filtered data word Fdw. The totaling operation of the velocity integrator 26 can be mathematically expressed by the following equation:

$$VInt_{(xt)} = Kf * \sum_{n=0}^{x} VSub_{(nt)}$$

where $VInt_{(xt)}$ represents the estimated delta frequency data word DFdw measured at time xt, $VSub_{(nt)}$ represents the filtered data word Fdw at time nt, x and n are integers and $x >> 0$, t is the sampling period (i.e., 1/15.625 MHz), and Kf is a scaling factor controlling the low frequency response of the control loop (as described in greater detail below). The above-described equation depicts a recursive adding function that accumulates the count value of the filtered data word Fdw at a clock rate of 15.625 MHz.

The scaling factor Kf is a predefined constant which determines the cut-off-frequency (response) of the control loop. The value of the scaling factor Kf should be greater than 0 and less than 1. The process of selecting the scaling factor Kf is very similar to the technique of Selecting cut-off-frequencies in filter designs. Cut-off-frequencies from 10 Hz to 1 KHz can be chosen for studying jitter characteristics of FDDI clock synchronizers. Frequencies of less than 10 Hz are not recommended because of the requirement for a long loop-settling time, resulting in long test time. Selecting frequencies higher than 1 KHz is also undesirable because, if the differentiated jitter component ω[jitter] contains frequency components below 1 KHz, the jitter is underestimated.

The velocity integrator 26 can be implemented with an up/down counter chain while the scaling function can simply be an "offset-tap-out" from an output of the counter-chain. For example, if an 8-bit counter chain is used for the totaling the count value of the filtered data word Fdw, the estimated delta frequency data word DFdw can be taken from the four higher-order bits. By utilizing the four higher-order, a scaling factor of 1/16 can be realized.

Figure 7:
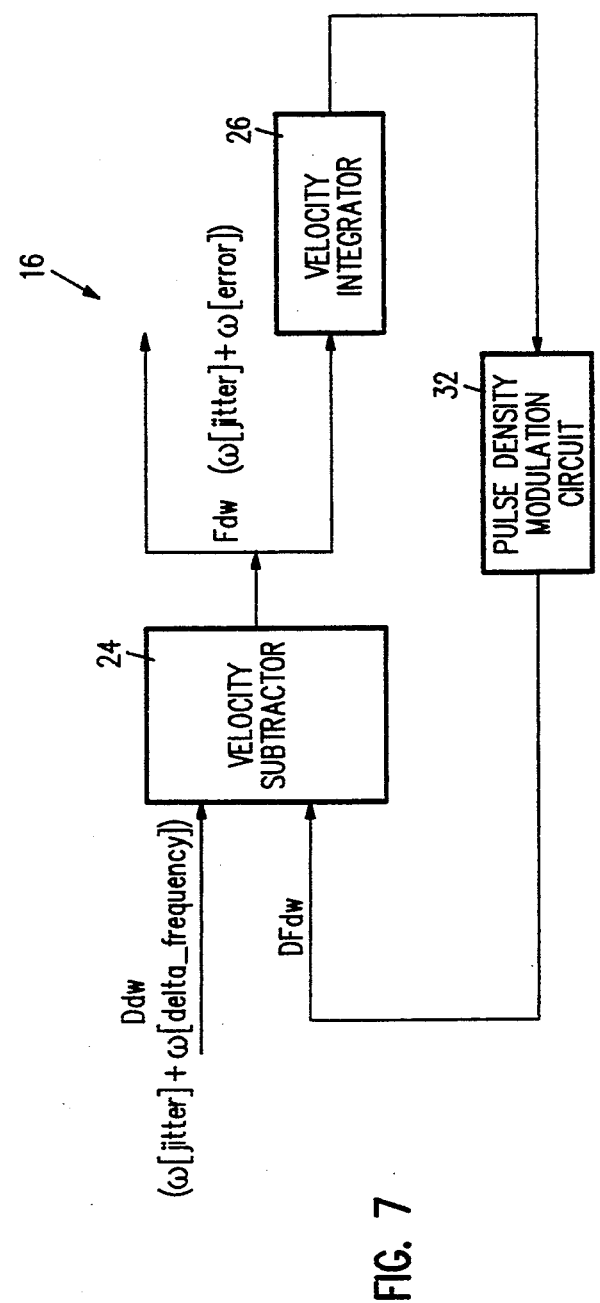
FIG. 7 is a block diagram illustrating the control loop with a pulse density modulation circuit 32.

As shown in FIG. 7, the estimated delta frequency data word DFdw can be further processed to provide the 2-bit word by utilizing a pulse density modulation (PDM) circuit 32 as described in U.S. Pat. No. 5,056,054, entitled "Digital Phase Locked Loop utilizing a Multi-bit Phase Error input for control of a Stepped Clock Generator", which is hereby incorporated by reference. The PDM device, which implements a recursive adding technique, is a cost-effective technique for matching the word format required by the velocity subtractor 24.

As stated above, the filtered data word Fdw primarily represents the differentiated jitter component ω[jitter] after the differentiated delta frequency component ω[delta_frequency] is removed by the velocity subtractor 24. The differentiated jitter component ω[jitter], which represents the derivative of the jitter component θ[jitter] of a phase data word Pdw, must be integrated with respect to time to obtain the original jitter component θ[jitter].

Referring to FIG. 2, the jitter integrator 18, which integrates the differentiated jitter component ω[jitter], can be summarized by the following equation:

$$JInt_{(xt)} = Ival + \sum_{n=0}^{x} VSub_{(nt)}$$

where $JInt_{(xt)}$ represents the jitter data word Jdw measured at time xt, Ival represents an integration constant, as described in greater detail below, $VSub_{(nt)}$ represents the filtered data word Fdw at time nt, x and n are integers and $x >> 0$, and t is the sampling period (i.e., 1/15.625 MHz).

The above-described equation depicts a recursive adding function which is used to total the count values of the filtered data word Fdw at a clock rate of 15.625 MHz so that the jitter data word Jdw represents the relative phase position of the recovered clock at time xt. The dimension of the jitter data word is expressed in radians where each count is equivalent to 0.0327 radians.

As with the velocity integrator 26 (FIG. 4), in the preferred embodiment of the present invention, the jitter integrator 18 can be implemented as an up/down counter chain. For hardware implementation purposes, the integration constant Ival must be initialized to a value which prevents both an underflow and an overflow in the counter chain. The integration constant Ival can be set to an arbitrary value which does not necessarily reflect the true value of the absolute phase delay of the recovered clock signal. In fact, the absolute phase information is lost during the process of jitter extraction.

In the present invention, the jitter data word Jdw contains no absolute phase information from the recovered clock signal. In general, absolute phase information is not required for jitter measurements. For example, to measure peak-to-peak jitter values of the recovered clock signal, the result is evaluated by subtracting the minimum count value of the jitter data word Jdw from the maximum count value of the jitter data word Jdw. When the jitter integrator is implemented with a counter chain, the integration constant Ival can be set to a center count of the counter chain.

Under normal operation, the integration constant Ival defines the center value (or the mean value) of the jitter data word Jdw. When the value of the integration constant Ival is the center of the full output range of the jitter integrator 18, undistorted peak jitter readings can be provided. However, if the system clock frequencies contain interferences such as minor phase or frequency hits, the mean value of the jitter data word Jdw may drift to new values which may severely reduce the dynamic range of the jitter integrator 18. This, in effect, may distort the peaks of the jitter readings. This phenomenon is due to the non-zero-mean value (due to the minor phase or frequency hits) of the error component ω[error] being integrated by the jitter integrator 18.

Figure 8:
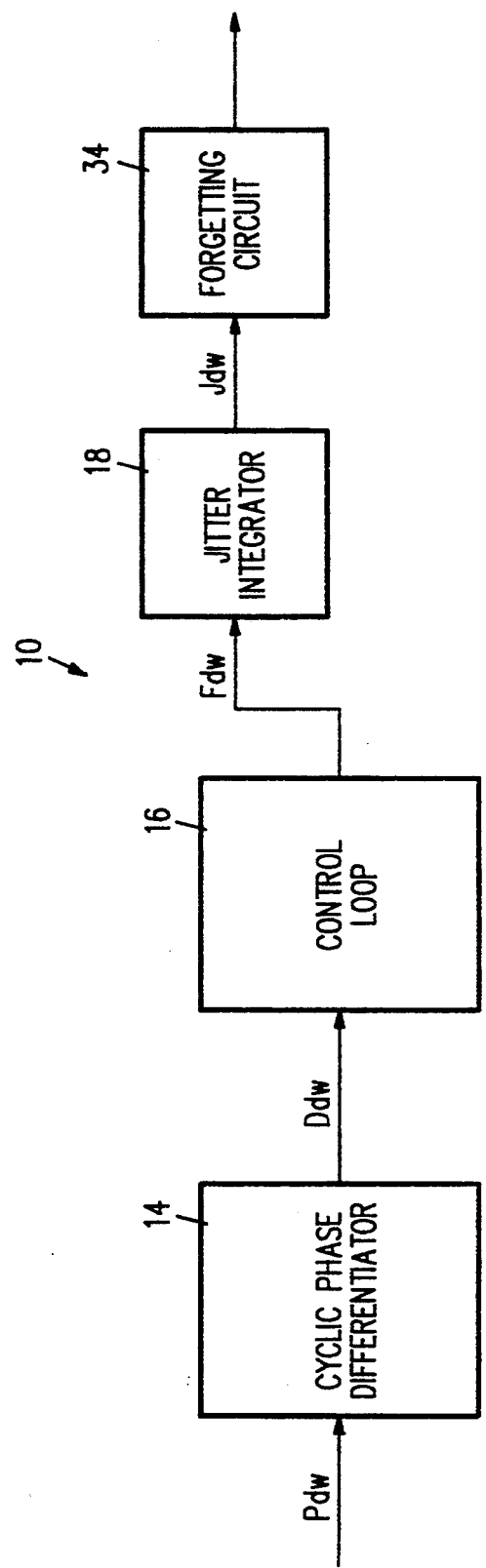
FIG. 8 is a block diagram illustrating the jitter extraction circuit witch a forgetting circuit 34.

By introducing a "forgetting-factor" to the jitter integrator 18, this problem can be solved. As shown in FIG. 8, the "forgetting-factor" can be implemented with a forgetting circuit 34 which periodically reduces the count value of the jitter data word Jdw towards the center count. An analog equivalent approach is to include a resistive (lossy) path to an ideal integrator. The "forgetting-factor" technique allows the mean value of jitter data word Jdw to center around integration constant Ival after minor phase or frequency hits.

The jitter extraction circuit 10 described above can be constructed with traditional discrete circuit building blocks, such as counters, adders and registers. In the preferred embodiment, the circuit 10 interfaces with a clock synchronizer circuit such as the Player+ TM, Model No DP83257 from National Semiconductor, through a parallel bus. The parallel bus provides the phase data words via an internal data port, PAP. This implementation method offers a practical test platform for manufacturing clock synchronizers. Since the Jitter Extraction circuitry is off-chip, there is no addition cost to the basic clock synchronizer function, except the hardware for the communication port.

In a first alternative embodiment, a general purpose computer (not shown in FIG. 2) and a jitter extraction program can be utilized in lieu of the cyclic phase differentiator 12, the velocity subtractor 24, the velocity integrator 26, and the jitter integrator 18. When a general purpose computer is utilized, the jitter extraction program directs the computer to read a current phase data word from the above-referenced clock synchronizer, store the current phase data word, and subtract a previously stored phase data word from the current phase data word to produce the differentiated phase data word. The estimated delta frequency data word is then subtracted from the differentiated phase data word to produce the filtered data word. The filtered data word is totaled to produce both the estimated delta frequency data word and the jitter data word.

The use of a general purpose computer may produce throughput problems due to computational speed limitations of the computer. If throughput problems are encountered, the general purpose computer can operate in a single-shot mode where the jitter extraction software is executed after a sequence of phase data words are captured.

Although the single-shot mode does not provide a continuous output of jitter data words, the single-shot mode is particularly useful in analyzing transient jitter characteristics of the above-referenced clock synchronizer. For example, when the clock synchronizer is acquiring an incoming data bit stream, the jitter extraction circuit 10 cannot obtain a jitter measurement because there is not enough time or data for estimating the long term average of delta frequency component ω[delta_frequency]. On the other hand, the single-shot mode allows an estimated delta frequency component ω[delta_frequency] to be applied to the phase data word because the single-shot mode is a non-real-time process.

The utilization of a general purpose computer with a jitter extraction program offers a cost effective solution to the jitter testing of clock synchronizers. When the general purpose computer embodiment is implemented together with the jitter extraction circuit 10, a complete jitter analyzer can be built with both continuous and transient jitter measuring capabilities.

In addition to the phase data words, the above-referenced clock synchronizer also generates 8-bit frequency data words at a rate of 15.625 Mega-words per second. Each frequency data word represents the frequency difference between the recovered clock and the local reference clock. The possible range is from 0 to 255 (8 bits, 256 counts) which equates to 1.3 ppm per count.

In a second alternative embodiment, frequency data words which have been averaged can be utilized in lieu of the estimated delta frequency data words since the estimated delta frequency data words replicate the value of the long term average of the frequency data words. By averaging the frequency data words using well-known circuits, the velocity integrator 18 can be eliminated.

As stated above, measuring jitter is a complicated task which requires sophisticated laboratory equipment around the test setup. Therefore, by incorporating both the jitter extraction circuit 10 and the above-referenced clock synchronizer onto a single integrated circuit, jitter measurements for each integrated circuit can be easily and inexpensively provided. This value-added feature also increases the testability of the clock synchronizer function when it is impossible to add an external hardware jitter extractor to an existing ATE (Automatic Testing Equipment) in a production environment.

As described above, the differentiated phase data word is a replica of the signals UP_PI and EN_PI used in the "Digital Signed Phase-to-Frequency Converter for Very High Frequency PLL's" under [4]. In addition, the function of cyclic phase differentiator 14 is an inverse function of the Phase-to-Frequency Converter of the above-referenced application. This duplicating effort allows the jitter extractor 10 to be built externally to the clock synchronizer. Furthermore, the number of system connections can be kept to a minimum by sending jitter data through a standard interface bus.

As indicated previously, some circuit blocks such as the cyclic phase differentiator 12 and the velocity integrator would be redundant if the jitter extraction circuit 10 were built as an integral part of an integrated circuit clock synchronizer. The cyclic phase differentiator 12 and the velocity integrator 26 can be eliminated without sacrificing performance. In addition, no implementation conflicts exist between generating the phase data words and an on-chip jitter extractor. Thus, the phase data words can be included in an integrated approach if an interface to an external software jitter extractor is required. For an on-chip jitter extractor implementation where cost is of primary concern, the frequency data words can be used instead of estimated delta frequency data words after some form of averaging circuit.

Figure 5:
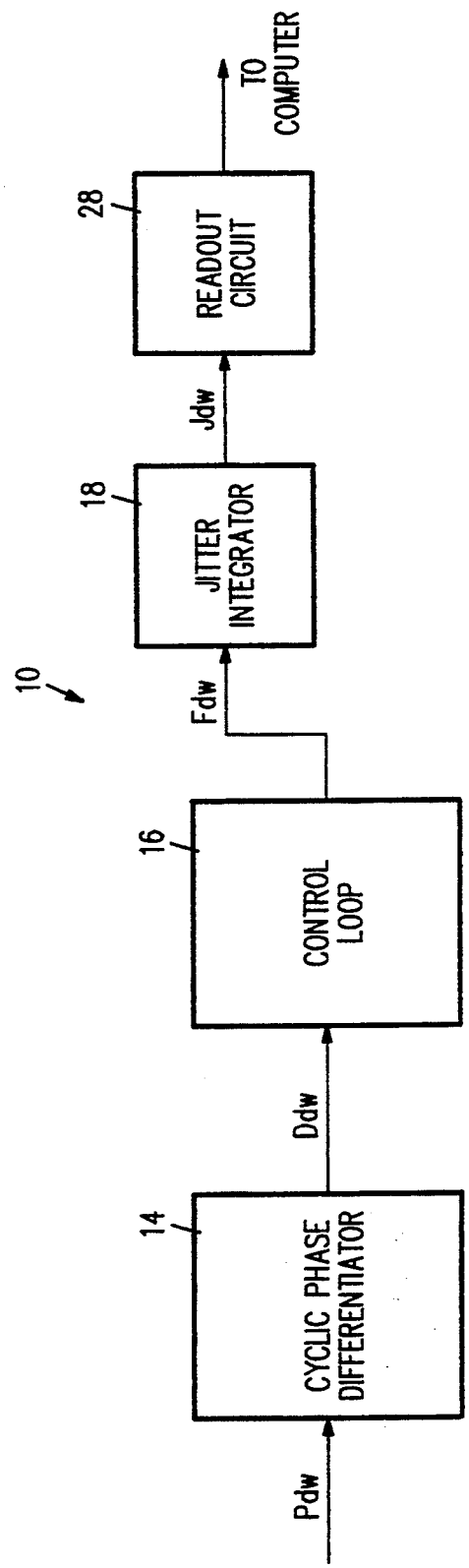
FIG. 5 is a block diagram illustrating the jitter extraction circuit with a readout processor.

FIG. 5 shows a block diagram of the jitter extraction circuit 10 of the present invention with a readout processor. As shown in FIG. 5, in addition to the above described jitter extraction circuit 10, the jitter extraction circuit 10 can also include a readout circuit 28 that manipulates the jitter data words Jdw. The manipulated results, which can show the jitter statistics in various forms such as a "Peak-to-peak Tracker" and "RMS Converter", can be sent to a personal computer for presentation.

It should be understood that various alternatives to the structures described herein may be employed in practicing the present invention. It is intended that the following claims define the invention and that structures within the scope of these claims and their equivalents be covered thereby.

What is claimed is:

1. A jitter extraction circuit for measuring the jitter of a recovered clock signal, the jitter extraction circuit comprising:
   a cyclic phase differentiator that receives a plurality of successive r-bit phase data words containing phase movement information of the recovered clock signal, and that differentiates the phase data words to produce a plurality of successive two-bit differentiated phase data words, r representing an integer greater than four;
   a control loop that estimates and removes a delta frequency component from the plurality of differentiated phase data words to produce a plurality of successive t-bit filtered data words, where t represents an integer greater than two, each filtered data word having a value; and
   a jitter integrator that integrates the t-bit filtered data words to produce a plurality of successive jitter data words, the jitter data words having a value.

2. The jitter extraction circuit of claim 1 wherein the cyclic phase differentiator comprises:
   a phase delay circuit that delays the phase data words to produce a plurality of r-bit delayed phase data words; and
   a phase subtracter that receives the phase data words and the delayed phase data words so that each delayed phase data word has a corresponding phase data word, and that subtracts each delayed phase data word from the corresponding phase data word to produce each of the differentiated phase data words.

3. The jitter extraction circuit of claim 2 wherein the control loop comprises:
   a velocity subtracter that receives a plurality of m-bit estimated delta frequency data words and the plurality of differentiated phase data words so that each estimated delta frequency data word has a corresponding differentiated phase data word, and that subtracts each estimated delta frequency data word from the corresponding differentiated phase data word to produce each t-bit filtered data word; and
   a velocity integrator that receives the plurality of t-bit filtered data words, and that integrates the filtered data words to produce the plurality of m-bit estimated delta frequency data words,
   wherein the m-bit estimated delta frequency data words represent an estimate of the delta frequency component.

4. A jitter extraction circuit for measuring the jitter of a recovered clock signal, the jitter extraction circuit comprising:
   a cyclic phase differentiator that receives a plurality of successive r-bit phase data words containing phase movement information of the recovered clock signal, where r represents an integer, and that differentiates the phase data words to produce a plurality of successive s-bit differentiated phase data words, where s represents an integer less than r;
   a velocity subtracter that receives a plurality of successive m-bit estimated delta frequency data words and the plurality of differentiated phase data words so that each estimated delta frequency data word has a corresponding differentiated phase data word, and that produces a plurality of successive t-bit filtered data words in response thereto, each filtered data word being produced by subtracting each estimated delta frequency data word from the corresponding differentiated phase data word;
   a velocity integrator that receives the plurality of t-bit filtered data words, and that integrates the filtered data words to produce a plurality of successive z-bit integrated delta frequency data words;
   a pulse density modulation circuit connected between the velocity integrator and the velocity subtracter that produces one of the m-bit filtered data words each time a value represented by the integrated delta frequency data word is greater than an upper value or less than a lower value; and
   a jitter integrator that integrates the t-bit filtered data words to produce a plurality of successive jitter data words.

5. A jitter extraction circuit for measuring the jitter of a recovered clock signal, the jitter extraction circuit comprising:
   a cyclic phase differentiator that receives a plurality of successive r-bit phase data words containing phase movement information of the recovered clock signal, where r represents an integer, and that differentiates the phase data words to produce a plurality of successive s-bit differentiated phase data words, where s represents an integer less than r;
   a velocity subtracter that receives a plurality of successive m-bit estimated delta frequency data words and the plurality of differentiated phase data words so that each estimated delta frequency data word has a corresponding differentiated phase data word, and that produces a plurality of successive n-bit subtracted phase data words, where n represents an integer greater than s, in response thereto, each subtracted phase data word having a value and being formed by subtracting each estimated delta frequency data word from the corresponding differentiated phase data word;
   a redistribution circuit that produces a plurality of successive t-bit filtered data words, where t represents an integer less than n, by redistributing the values of the filtered data words to values that represent the values of the plurality of subtracted data words over time;
   a velocity integrator that receives the plurality of t-bit filtered data words, and that integrates the filtered data words to produce the plurality of m-bit estimated delta frequency data words; and
   a jitter integrator that integrates the t-bit filtered data words to produce a plurality of successive jitter data words.

6. The jitter extraction circuit of claim 5 wherein the redistribution circuit converts a subtracted data word having a value greater than positive one into a series of filtered data words having a value of positive one, and having a value less than minus one into a series of filtered data words having a value of minus one, and that combines a subtracted data word having a value of positive one with a value of negative one to produce a filtered data word having a value of zero, and having a value of positive one with a value of negative one to produce a filtered data word having a value of zero.

7. The jitter extraction circuit of claim 1 and further comprising a forgetting circuit that periodically reduces the value of the jitter data word to produce a reduced-value jitter data word.

8. The jitter extraction circuit of claim 4 and further comprising a forgetting circuit that periodically reduces a value of the jitter data word to produce a reduced-value jitter data word.

9. The jitter extraction circuit of claim 4 wherein the velocity integrator totals a count value of a series of filtered data words to produce the estimated delta frequency data word.

10. The jitter extraction circuit of claim 9 wherein the jitter integrator totals a count value of a series of filtered data words to generate the jitter data word.

11. A method for measuring the jitter of a recovered clock signal, the method comprising the steps of:
obtaining a phase difference between a reference clock signal and an incoming data bit stream;
generating a plurality of successive r-bit phase data words in response to the phase difference, each phase data word containing phase movement information of the recovered clock signal;
differentiating the phase data words to produce a plurality of successive two-bit differentiated phase data words, where r represents an integer greater than four;
estimating and removing a delta frequency component from the differentiated phase data words to produce a plurality of successive t-bit filtered data words, where t represents an integer; and
integrating the filtered data words to produce a plurality of successive jitter data words.

12. The method of claim 11 wherein the differentiating step further comprises the steps of:
delaying the phase data words to produce a plurality of r-bit delayed phase data words; and
receiving the phase data words and the delayed phase data words so that each delayed phase data word has a corresponding phase data word; and
subtracting each delayed phase data word from the corresponding phase data word to produce each of the differentiated phase data words.

13. The method of claim 12 wherein the estimating and removing step further comprises the steps of:
receiving a plurality of m-bit estimated delta frequency data words and the plurality of differentiated phase data words so that each estimated delta frequency data word has a corresponding differentiated phase data word;
subtracting each estimated delta frequency data word from the corresponding differentiated phase data word to produce each t-bit filtered data word; and
integrating the filtered data words to produce the plurality of m-bit estimated delta frequency data words,
wherein the m-bit estimated delta frequency data words represent an estimate of the delta frequency component.

14. The jitter extraction circuit of claim 1 wherein the control loop comprises:
a velocity subtracter that receives a plurality of m-bit estimated delta frequency data words and the plurality of differentiated phase data words so that each estimated delta frequency data word has a corresponding differentiated phase data word, and that produces a plurality of n-bit subtracted phase data words, where n represents an integer greater than two, in response thereto, each subtracted phase data word having a value and being formed by subtracting each estimated delta frequency data word from the corresponding differentiated phase data word;
a redistribution circuit that produces the plurality of t-bit filtered data words, where t represents an integer less than n, by redistributing the values of the filtered data words to values that represent the values of the plurality of subtracted data words over time; and
a velocity integrator that receives the plurality of t-bit filtered data words, and that integrates the filtered data words to produce the plurality of m-bit estimated delta frequency data words.

15. The jitter extraction circuit of claim 1 and wherein the control loop comprises:
a velocity subtracter that receives a plurality of m-bit estimated delta frequency data words and the plurality of differentiated phase data words so that each estimated delta frequency data word has a corresponding differentiated phase data word, and that produces the plurality of t-bit filtered data words in response thereto, each filtered data word being produced by subtracting each estimated delta frequency data word from the corresponding differentiated phase data word;
a velocity integrator that receives the plurality of t-bit filtered data words, and that integrates the filtered data words to produce a plurality of z-bit integrated delta frequency data words; and
a pulse density modulation circuit connected between the velocity integrator and the velocity subtracter that produces one of the m-bit filtered data words each time a value represented by the integrated delta frequency data word is greater than an upper value or less than a lower value.

16. A jitter extraction circuit for measuring the jitter of a recovered clock signal, the jitter extraction circuit comprising:
a cyclic phase differentiator that receives a plurality of successive r-bit phase data words containing phase movement information of the recovered clock signal, and that differentiates the phase data words to produce a plurality of successive s-bit differentiated phase data words, r and s representing integers where r is more than two times greater than s;
a control loop that estimates and removes a delta frequency component from the plurality of differentiated phase data words to produce a plurality of successive t-bit filtered data words, where t represents an integer greater than s; and
a jitter integrator that integrates the t-bit filtered data words to produce a plurality of successive jitter data words.

* * * * *